United States Patent [19]

Cockerham

[11] Patent Number: 4,797,827

[45] Date of Patent: Jan. 10, 1989

[54] ANGULAR POSITION DETECTOR

[75] Inventor: Kevin Cockerham, Birmingham, England

[73] Assignee: Lucas Industries Public Limited Company, Birmingham, England

[21] Appl. No.: 899,778

[22] Filed: Aug. 22, 1986

Related U.S. Application Data

[63] Continuation of Ser. No. 625,893, Jun. 29, 1984, abandoned.

[30] Foreign Application Priority Data

Jul. 2, 1983 [GB] United Kingdom ................. 8318008

[51] Int. Cl.[4] ......................... F02P 5/03; H03K 13/02

[52] U.S. Cl. ............................... 364/431.03; 364/559; 377/17; 377/44; 328/120; 123/414

[58] Field of Search ........................... 364/559, 431.03; 123/414; 328/5, 120; 307/515, 516; 340/347 M, 347 P; 73/462; 377/39, 17, 44, 110; 324/166

[56] References Cited

U.S. PATENT DOCUMENTS 3,949,199 4/1976 Odom .................................... 377/44
4,233,592 11/1980 Leichle .................................. 377/17
4,442,822 4/1984 Kondo et al. ........................ 123/414
4,553,427 11/1985 Kuraoka et al. ..................... 123/414
4,628,269 12/1986 Hunninghaus et al. ............. 328/120

FOREIGN PATENT DOCUMENTS 0018784 2/1979 Japan .................................. 328/120
0062364 4/1983 Japan .................................. 123/414
0142442 8/1983 Japan ..................................... 377/44
0574732 10/1977 U.S.S.R. ................................ 377/39

OTHER PUBLICATIONS

"System for Eliminating Home Emitter Wheel" by J. A. Carlson et al., IBM Technical Disclosure Bulletin, vol. 15, No. 11, Apr. 73.

*Primary Examiner*—Parshotam S. Lall
*Attorney, Agent, or Firm*—Holman & Stern

[57] ABSTRACT

An angular position detector for an internal combustion engine includes a toothed wheel with a missing tooth and a sensor providing a pulse train as the teeth pass the sensor. To provide an accurate datum position signal a micro-computer receives the pulse train and outputs the datum signal when the period between successive pulses is significantly shorter than the preceding period.

5 Claims, 2 Drawing Sheets

ANGULAR POSITION DETECTOR

This is a continuation of application Ser. No. 625,893, filed June 29, 1984, now abandoned.

BACKGROUND OF THE INVENTION

This invention relates to an angular position detector suitable for use in an internal combustion engine control system.

It is already known to employ a toothed wheel on the engine crankshaft with a fixed sensor which provides a pulse train as the wheel rotates, the pulse train being used to provide information about both the speed and angular position of the crankshaft. It is, however, necessary, when measuring the angular position to provide a signal at a specific datum position so that the position of the crankshaft can be measured from that datum position. GB-A No. 2065310 discloses the idea of omitting one of the teeth. The time intervals between the pulses are measured and when a time interval more than 1.5 times longer than the previous one is detected it is assumed that the "missing tooth" is passing the sensor and the next arriving pulse is treated as defining the datum position.

It is desirable for accurate engine timing control to ensure that the datum position is close to the top dead centre position in respect to one of the cylinders of the engine. Accordingly, it is proposed in GB-A No. 2065310, to put the "missing tooth" at this top dead centre position, the datum position then being, say, 10° behind this top dead centre position.

With such an arrangement, however, problems can arise during engine starting, particularly in very cold conditions. In such conditions the load on the starter motor during each compression stroke can be such as to reduce the instantaneous cranking speed sufficiently to make an inter-pulse interval (other than that occurring at top dead centre) 50% longer than the previous interval, due to the reduced cranking speed so that a false datum position signal is produced where there is no gap detected, due to a false detection of the usual spacing between adjacent teeth or the gap.

SUMMARY OF THE INVENTION

It is an object of the present invention to provide a position detector in which this disadvantage is avoided without adding extra teeth or specially shaped teeth.

An angular position detector in accordance with the invention comprises a toothed wheel having a missing tooth, a sensor device producing a pulse train as the teeth of the toothed wheel pass it, and a discriminating circuit connected to said sensor device and producing a datum signal in response to recognition of the passage past the sensor device of the missing tooth by measuring the time intervals between the pulses of said pulse train, characterised in that said discriminating circuit recognises said missing tooth by detecting when an interpulse interval is significantly shorter than the preceding interval.

BRIEF DESCRIPTION OF THE DRAWINGS

In the accompanying drawings.

DETAILED DESCRIPTION OF THE INVENTION

Figure 1:
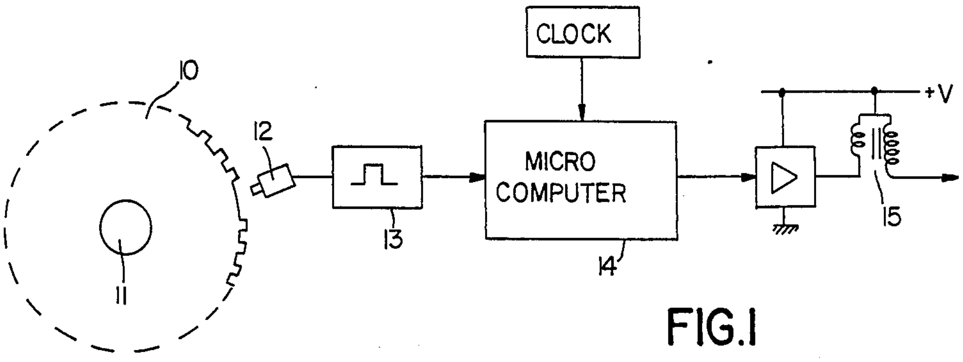
FIG. 1 being a block diagram of an example of the invention.

As shown in FIG. 1 the detector includes a toothed wheel 10 mounted on an internal combustion engine crankshaft 11 and coacting with a variable reluctance sensor 12 associated with an amplifier switching circuit 13 which produces a pulse train consisting of pulses synchronised with the passage of the leading edges of the teeth of wheel 10 past the sensor 12. The wheel 10 has one tooth missing, the wheel being arranged on the crankshaft at a position such that the pulse which would have been produced as the missing tooth passes the sensor, coincides with the top dead centre position of one of the cylinders of the engine.

The output of the circuit 13 is applied to an input of a micro-computer 14 which is shown in FIG. 1 as controlling the ignition coil 15 of the spark ignition system of the engine. The detector may, however, be used to control other engine timing functions if required.

Figure 2:
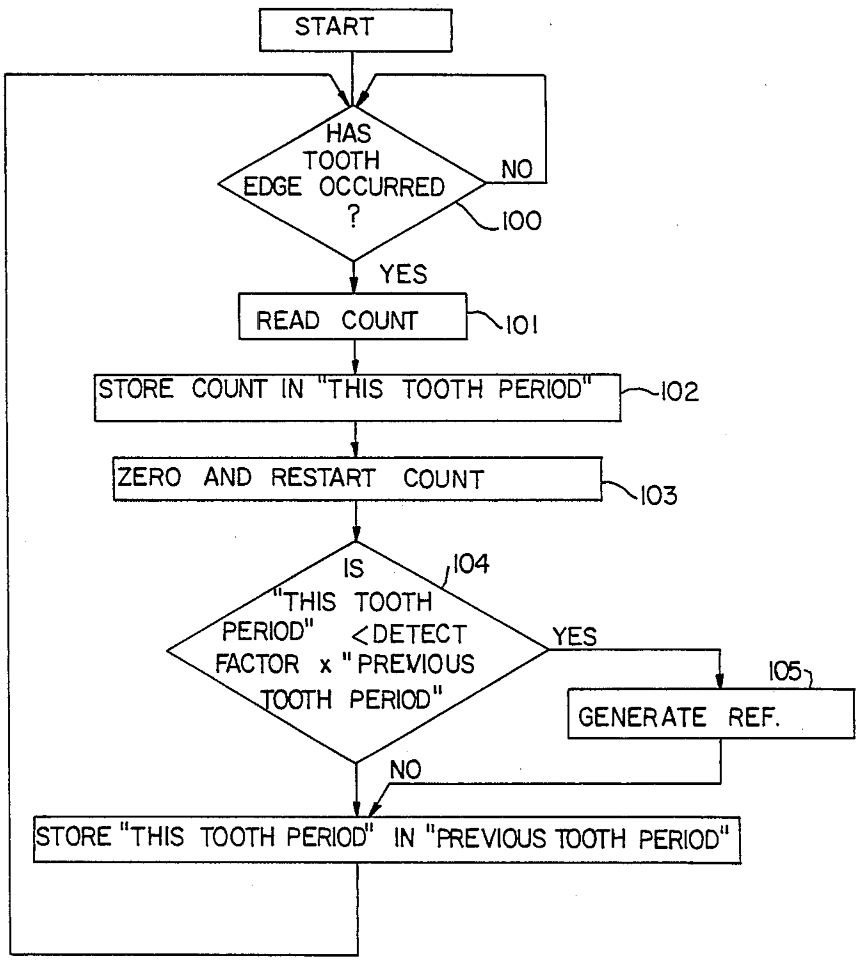
FIG. 2 the flow sheet of the relevant part of the programme of a micro-computer included in FIG. 1.

The relevant part of the stored programme of the micro-computer is shown in FIG. 2. The routine shown includes a decision 100 as to whether a tooth edge signal has been received, which is repeated until a tooth edge signal arrives. The count in a software counter is then read (101) and stored (102) in a register "THIS TOOTH PERIOD". The counter is zeroed and re-started (103) for the next cycle. Now a decision 104 is made as to whether the content of the "THIS TOOTH PERIOD" register is less than the product of a detect factor (e.g. 0.65) and the content of a "PREVIOUS TOOTH PERIOD" register. If a "yes" decision is reached the reference signal is generated (105). The content of the "THIS TOOTH PERIOD" register is then transferred to the "PREVIOUS TOOTH PERIOD" register before returning to the beginning of the routine.

Figure 3:
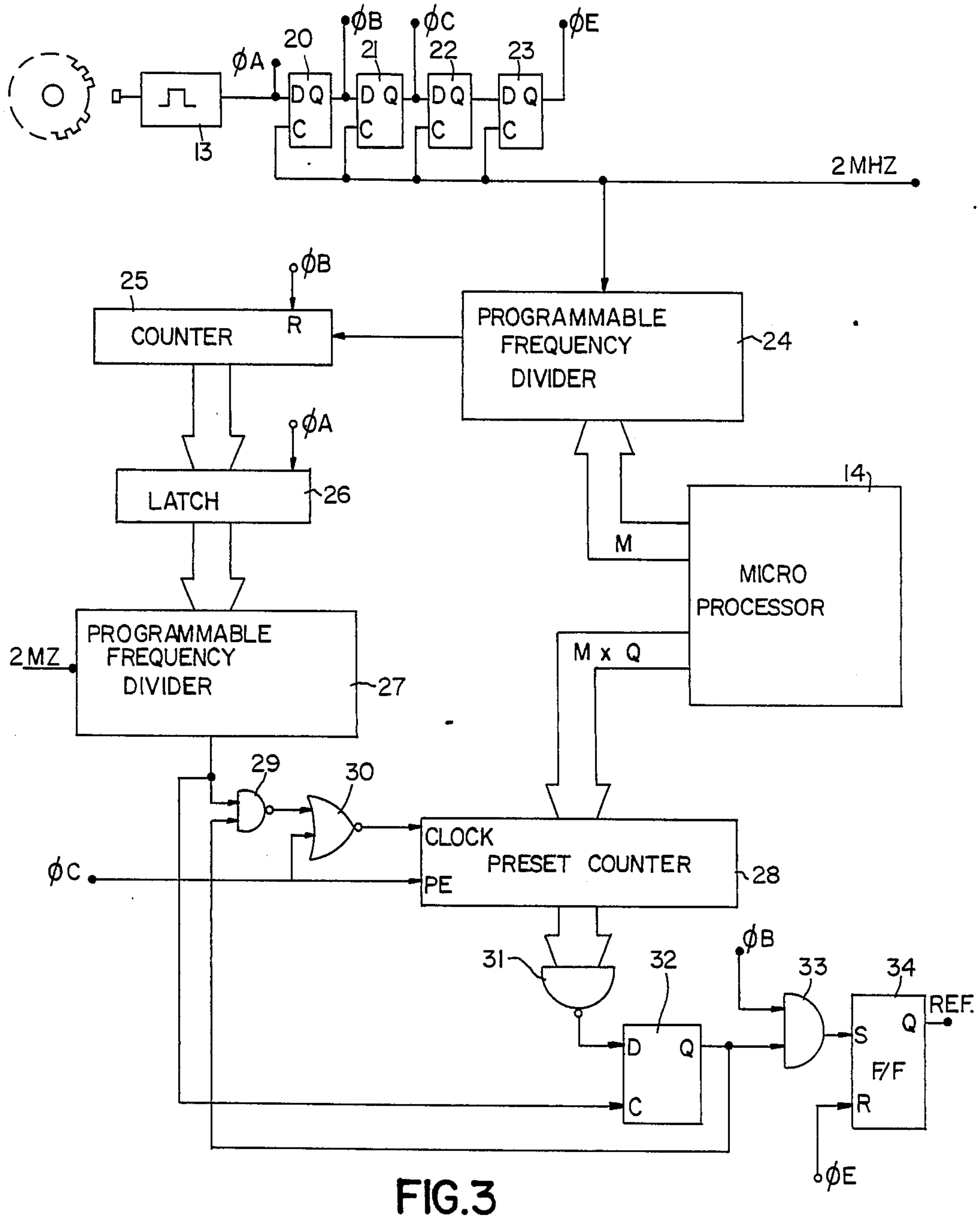
FIG. 3 is a block diagram of another example of the invention.

Turning now to FIG. 3, the alternative example of the invention shown therein makes use of a special interface circuit between the amplifier/switching circuit 13 and the micro-computer 14, to generate the reference signal at the appropriate tooth edge signal. This interface circuit includes four latch circuits 20 to 23 in cascade which are clocked by a 2 MHz clock signal to produce signals ØB, ØC and ØE respectively 0.5 US, 1 US and 2 US after the tooth edge signal ØA. A programmable frequency divider 24 divides the 2 MHz pulse train by a number M determined by the micoprocessor 14, and the divided pulse train is counted by a counter 25, reset periodically by the ØB signals. Each ØA signal causes a latch 26 to be loaded with the count in counter 25 and the content of latch 26 controls the division ratio of a second programmable frequency divider 27 which divides the 2 Mz pulse train by such latch content. In steady conditions, i.e. when successive ØA signals are equally spaced, the output of divider 27 is $M \times f$ (where f is the frequency of the ØA signals).

For generating the reference signal after detection of the missing tooth, there is provided another counter, which is a presettable Johnson counter 28 loaded periodically with a count $M \times Q$ (where Q is a detect factor, e.g. 0.65) which is clocked by the ouptut of the divider 27. To this end the output of divider 27 is connected to one input of a NAND gate 29, the output of which is connected to one input of a NOR gate 30, the output of which is applied to the CLOCK input of counter 28. The ØC signal is applied to the PRESET/ENABLE input of the counter 28 and to the other input of NOR gate 30 so that counter 28 is preset when the ØC is high and counts when such signal is low. A NAND gate is connected to the stage output (except the LSB output) of counter 28 and its output is connected to the D input of a latch 32 which is clocked by the output of divider 27. The Q output of latch 32 is connected to an input of NAND gate 29 and also to an input of an AND gate 33 which also receives the ØB signal. The output of gate 33 is applied to the SET input of a flip-flop 34, the RESET input of which receives the ØE signal.

When the ØA signal frequency is fixed the counter 28 reaches its 11 . . . . 10 state in every cycle so that the output of gate 31 goes low at some point before the next ØB signal arrives. Thus, latch 32 is set with its Q output low so that gate 29 inhibits further counting in that cycle. In the cycle in which the missing tooth passes the detector, however, the counter 25 will reach twice its normal count so that in the next cycle the frequency of the output of divider 27 is half its normal value. The result of this is the output of gate 31 and that of latch 32 have not gone low when the next ØB pulse arives, so that flip-flop 34 is set and its Q output goes high for 1.5 US, providing the reference pulse.

I claim:

1. An angular position detector, comprising:

a toothed wheel having a plurality of teeth, each one of said plurality of teeth being spaced apart from at least one adjacent tooth by a first predetermined angular spacing;

a gap between two adjacent teeth of said toothed wheel, said gap having a second predetermined angular spacing which is greater than said first predetermined angular spacing;

a sensing means for sensing the teeth of said toothed wheel, said sensing means being provided adjacent said toothed wheel, for producing an output signal in the form of a pulse train as individual ones of said plurality of teeth pass by said sensing means;

a discriminating means for discriminating the passing of said gap past said sensing means, said discriminating means receiving said output signal from said sensing means, said discriminating means including a datum signal generating means for generating a datum signal and a measurement means for measuring interpulse time intervals between successive pulses of said pulse train of said sensing means output signal, said discriminating means triggering said datum signal generating means for producing a datum signal in response to said gap passing by said sensing means, said discriminating means discriminating passage of said gap past said sensing means by comparing the current interpulse interval to the next preceding interpulse interval and triggering said datum signal generating means to generate a datum signal when the current interpulse interval is significantly shorter than the next preceding interpulse interval.

2. An angular position detector as claimed in claim 1, wherein said discriminating means includes a clock pulse generator and a micro-computer connected to said clock pulse generator and to said sensing means, said micro-computer being programmed to count the number of clock pulses output by said clock pulse generator between the occurrence of successive pulses of said pulse train output by said sensing means, and to compare the number of clock pulses counted during each interpulse interval between successive pulses of said pulse train with a fraction of the number of clock pulses counted during the next preceding interpulse interval.

3. An angular position detector as claimed in claim 1, wherein said discriminating means comprises:

a first programmable frequency divider for dividing the frequency of a fixed frequency pulse train by a divisor M, a first counter operably connected to said first programmable frequency divider to count pulses output by said first programmable frequency divider, said first counter being also operably connected to said sensing means so as to be periodically reset by said sensing means, a second programmable frequency divider operably connected to said first counter for dividing the frequency of said fixed frequency pulse train by a number equal to the count in said first counter immediately before said first counter was last reset, a second counter presettable to a number equal to a product of said divisor M times a number Q, said number Q being less than one, said second counter being connected to count pulses output by said second frequency divider, and means for supplying a signal representing the divisor M to the first frequency divider and for supplying a signal representing said number equal to M times Q to the second counter, said datum signal generating means producing said datum signal when the number of pulses output from said frequency divider in any cycle exceeds M times Q.

4. In an internal combustion engine having an engine control system, an angular position detector comprising:

a toothed wheel having a missing tooth, said toothed wheel being driving for rotation by a crankshaft of said engine;

a sensor device for producing a pulse train as the teeth of the toothed wheel pass it, said sensor device being arranged so that when the missing tooth of the toothed wheel is passing the sensor device, the crankshaft of the engine is at an angular position coinciding with a cylinder of the engine being substantially in a top dead center condition; and a discriminating circuit operably connected to said sensor device and producing a datum signal in response to recognition by said discriminating circuit of the passage past the sensor device of the missing tooth of the toothed wheel, the discriminating circuit measuring interpulse time intervals between successive pulses of said pulse train, wherein said discriminating circuit recognizes the passage of said missing tooth past the sensor device by detecting when an interpulse time interval between successive pulses of said pulse train is significantly shorter than the next preceding interpulse time interval.

5. In an internal combustion engine control system, an angular position detector for detecting when an engine crankshaft is at an angular position corresponding to an engine cylinder being substantially in a top dead center condition, the angular position detector comprising a toothed wheel having a missing tooth and driven for rotation by the engine crankshaft;

a sensor means for sensing passage thereby of teeth of the toothed wheel and for producing a pulse as each tooth of the toothed wheel passes thereby, the sensor means being arranged such that the missing tooth of the toothed wheel passes by the sensor means when the engine crankshaft's angular position corresponds to the engine cylinder top dead center condition; and a discriminating circuit means connected to the sensor means and receiving pulses output therefrom, for recognizing passage of the missing tooth past the sensor means and for producing a datum signal in response thereto, the discriminating circuit means measuring the time interval between pulses output by the sensor means and recognizing the passage of the missing tooth past the sensor means by detecting when a time interval between successive pulse output from the sensor means is substantially shorter than a next preceding interval.

* * * * *